United States Patent [19]

Leunbach et al.

[11] Patent Number: 5,314,681
[45] Date of Patent: May 24, 1994

[54] COMPOSITION OF POSITIVE & NEGATIVE CONTRAST AGENTS FOR ELECTRON SPIN RESONANCE ENHANCED MAGNETIC RESONANCE IMAGING

[75] Inventors: Ib Leunbach, Dragör; Klaes Golman, Rungsted, both of Denmark; Jo Klaveness, Oslo, Norway

[73] Assignee: Nycomed Innovation AB, Malmo, Sweden

[21] Appl. No.: 34,662

[22] Filed: Mar. 22, 1993

Related U.S. Application Data

[63] Continuation of Ser. No. 688,496, filed as PCT/EP89/01611, Dec. 20, 1989, abandoned.

[30] Foreign Application Priority Data

Dec. 23, 1988 [GB] United Kingdom ............... 8830215

[51] Int. Cl.⁵ ............... A61B 5/055; A61K 31/445; A61K 31/40; G01V 3/00
[52] U.S. Cl. .................. 424/9; 436/173; 436/806; 128/653.4; 324/307; 324/308; 514/315; 514/424; 514/836
[58] Field of Search ............... 424/9; 514/424, 315, 514/836; 324/307, 308; 436/173, 806; 128/653.4, 654

[56] References Cited

U.S. PATENT DOCUMENTS

| | | | |
|---|---|---|---|
| 4,615,879 | 10/1986 | Runge et al. | 424/9 |
| 4,637,929 | 1/1987 | Quay | 424/9 |
| 4,639,365 | 1/1987 | Sherry | 424/9 |
| 4,647,447 | 3/1987 | Gries et al. | 424/9 |
| 4,675,173 | 6/1987 | Widder | 424/9 |
| 4,687,659 | 8/1987 | Quay | 424/9 |
| 4,730,066 | 3/1988 | White | 556/50 |
| 4,746,507 | 5/1988 | Quag | 424/9 |
| 4,863,715 | 9/1989 | Jacobsen et al. | 424/9 |
| 4,863,717 | 9/1989 | Keana | 424/9 |
| 4,891,593 | 1/1990 | Lurie et al. | 324/307 |

FOREIGN PATENT DOCUMENTS

| | | |
|---|---|---|
| 1230114 | 12/1987 | Canada . |
| 0071564 | 7/1982 | European Pat. Off. . |
| 0130934 | 1/1985 | European Pat. Off. . |
| 0133674 | 3/1985 | European Pat. Off. . |
| 0160552 | 11/1985 | European Pat. Off. . |
| 0173163 | 3/1986 | European Pat. Off. . |
| 0184899 | 6/1986 | European Pat. Off. . |
| 0186947 | 7/1986 | European Pat. Off. . |
| 0230893 | 6/1987 | European Pat. Off. . |

(List continued on next page.)

OTHER PUBLICATIONS

Lurie, D. J. et al. J. Magnetic Resonance 76:366-70 (1988).
Sosnovsky, G. et al. Z. Naturforsch 41B:1170-7 (1986).
Villringer, A. et al. Magnetic Resonance in Medicine 6:164-74 (1988).
Bacic, G. et al. Magnetic Resonance in Medicine 8:209-18 (1988).
Alcock et al., Tetrahedron, 33, 2969-2980, 1977.
Golding et al., Synthesis, 7, 463-463, 1975.
Eriksson et al., J. Pharm. Sci., 77, 2, 97-103, 1988.
Hall et al., Magnetic Resonance in Medicine, 7, 248-252, 1988.

Primary Examiner—Gary E. Hollinden
Attorney, Agent, or Firm—Bacon & Thomas

[57] ABSTRACT

The invention relates to a modification of electron spin resonance enhanced magnetic resonance imaging (ES-REMRI) in which two magnetically responsive materials (contrast agents) are introduced into the sample being investigated, one contrast agent serving as an ESREMRI free induction decay signal enhancing agent and the other as enhancement suppressing agent. In this way, image contrast may be enhanced further for regions in which the suppressing agent distributes poorly or not at all or which the suppressing agent reaches at a later time than the enhancing agent.

19 Claims, No Drawings

FOREIGN PATENT DOCUMENTS

| | | |
|---|---|---|
| 0232751 | 8/1987 | European Pat. Off. . |
| 0235361 | 9/1987 | European Pat. Off. . |
| 0250358 | 12/1987 | European Pat. Off. . |
| 0255471 | 2/1988 | European Pat. Off. . |
| 0263059 | 4/1988 | European Pat. Off. . |
| 0331616 | 9/1989 | European Pat. Off. . |
| 0351919 | 1/1990 | European Pat. Off. . |
| 3324235A1 | 1/1985 | Fed. Rep. of Germany . |
| 3443251A1 | 5/1986 | Fed. Rep. of Germany . |
| 3443252A1 | 5/1986 | Fed. Rep. of Germany . |
| 3633245A1 | 3/1988 | Fed. Rep. of Germany . |
| 3640708A1 | 6/1988 | Fed. Rep. of Germany . |
| WO83/03920 | 11/1983 | PCT Int'l Appl. . |
| WO85/02772 | 7/1985 | PCT Int'l Appl. . |
| WO85/05554 | 12/1985 | PCT Int'l Appl. . |
| WO86/01112 | 2/1986 | PCT Int'l Appl. . |
| WO86/02841 | 5/1986 | PCT Int'l Appl. . |
| WO87/01594 | 3/1987 | PCT Int'l Appl. . |
| WO87/05222 | 9/1987 | PCT Int'l Appl. . |
| WO87/06229 | 10/1987 | PCT Int'l Appl. . |
| WO88/00060 | 1/1988 | PCT Int'l Appl. . |
| WO88/10419 | 12/1988 | PCT Int'l Appl. . |
| WO89/00557 | 1/1989 | PCT Int'l Appl. . |
| 2207766 | 2/1989 | United Kingdom . |

COMPOSITION OF POSITIVE & NEGATIVE CONTRAST AGENTS FOR ELECTRON SPIN RESONANCE ENHANCED MAGNETIC RESONANCE IMAGING

This application is a continuation of application Ser. No. 07/688,496, filed as PCT/EP89/01611, Dec. 20, 1989, now abandoned.

The present invention relates to improvements in and relating to magnetic resonance imaging (MRI) methods, in particular to improvements in electron spin resonance enhanced magnetic resonance imaging (ESREMRI) methods, and to contrast media for use in such methods.

In WO-A-88/10419, which corresponds to U.S. Pat. No. 4,984,573, the technique of ESREMRI is described. This technique involves using the coupling between electron spin resonance and nuclear spin resonance transitions to amplify the equilibrium population difference of the nuclear spin system and so to produce an enhancement in the detected free induction decay (FID) signal from which the magnetic resonance (MR) image is generated. This is done by stimulating an esr transition in a paramagnetic species naturally occuring in or introduced into the sample that is being imaged, which is generally but not essentially a human or animal subject. The enhancement of the FID signal may be by a factor of a hundred or more.

In practice, ESREMRI entails exposing a sample to a series of pulse sequences of a first radiation, generally but not essentially radiofrequency (RF) radiation, of a frequency selected to excite nuclear spin transitions in selected non-zero spin nuclei (the "imaging nuclei"—generally protons) in the sample, exposing the sample to a second radiation of a frequency selected to excite electron spin transitions in the paramagnetic species which are coupled to nuclear spin transitions of at least some of the imaging nuclei, detecting the FID signal from the sample during the pulse sequences, and from the detected signals generating the MR image of the sample.

The use of nitroxides in conjunction with paramagnetic metal species in Electron spin resonance imaging has previously been proposed (Bacic et al., Mag.Res in Med., 8, 209–219 1988), but no mention of applicability in ESREMRI systems is made.

Villringer et al (Mag.Res. in Med. 6, 164–174, 1988), describe the use of paramagnetic metal chelates as $T_2$ reducing magnetic susceptibility contrast agents for conventional MRI, but again made no mention of ESREMRI or the use of a combination of signal enhancing and signal suppressing agents. Similarly, whilst techniques for imaging solutions containing nitroxide free radicals are described by Lurie et al (J. Mag.Res.76, 366–370, 1988) no suggestion of using a combination of signal enhancing and signal suppressing agents was made.

In ESREMRI, selection of the paramagnetic material whose electron spin system couples with the nuclear spin system of the imaging nuclei is particularly important where imaging is to be performed on a living subject. For efficient amplification of the nuclear spin population difference, the second radiation should be of a frequency, bandwidth and intensity such as to maintain the electron spin system in an excited state, preferably at or near saturation. In in vivo imaging, it is, however, desirable to minimize the exposure of the patient to the second radiation, which is generally microwave (Mw) radiation, in order to avoid unwanted heating effects and it is therefore desirable to select a paramagnetic material having a stimulable esrtransition with long transverse and longitudinal relaxation times, $T_{2e}$ and $T_{1e}$, to allow the esr transition to be saturated or sufficiently excited as to achieve the desired enhancement of the FID signal without undue heating of the sample. Thus, as the FID signal enhancing paramagnetic material (hereinafter the "enhancing agent") there should be selected a material which has a narrow bandwidth transition in its esr spectrum, preferably a material which has only one or a small number, preferably 2–5, of such narrow bandwidth transitions in the spectrum. The use of conventional paramagnetic MRI contrast agents based on paramagnetic metal salts or chelate complexes, such as the gadolinium chelates (for example GD-DTPA) suggested by Schering in EP-A-71564, as enhancing agents is not feasible since these materials have very large esr linewidths and in order to achieve any significant amplification of the FID signal, the sample would have to receive unacceptably high exposure to the second, generally MW, radiation. In general, therefore, as the enhancing agent there should be chosen a material having a stimulable esr transition, having a linewidth of the order of 1 Gauss ($10^{-4}$ Tesla) or less.

As mentioned above, ESREMRI provides a method by which FID signal intensity can be amplified by a factor of, for example, 100 or more. Using this technique, it is thus possible to reduce the time required for acquiring each MR image-, to increase the spatial resolution of the image or to operate at lower primary magnetic fields without causing an unacceptable reduction in the signal to noise (SN) ratio. The present invention, however, is directed to the achievement in ESREMRI of increased contrast between different parts of the MR image, for example between different organs or tissue types of the sample, and in particular to the achievement of selective contrast enhancement of body tissues or organs.

Thus, we have found that the FID signal is suppressed, i.e. reduced or eliminated, in the presence of materials having unpaired electrons whose electron spin resonance transitions are not stimulated or are only stimulated to a minor extent by the second radiation. Such materials are referred to hereinafter as "suppression agents". Thus, where the distributions through a sample of an enhancing agent and a suppression agent overlap but are not identical, selective contrast between different regions of the sample can be achieved in ESREMRI.

Viewed from one aspect therefore, the present invention provides a method of generating a magnetic resonance image of a sample, said method comprising exposing said sample to pulses of a first radiation of a frequency selected to excite nuclear spin transitions in selected nuclei in said sample, detecting the free induction decay signal from said sample and generating a said image from said detected signal, said method further comprising introducing into said sample a first paramagnetic contrast agent (the "enhancing agent") and exposing said sample to a second radiation of a frequency selected to excite an electron spin transition of said first contrast agent coupled to nuclear spin transitions of at least some of said selected nuclei whereby to enhance the free induction decay signal therefrom, characterised in that said method also comprises introducing into said sample a second contrast agent (the "suppression agent") having at least one transition in the esr spectrum thereof whereby to reduce the enhancement of said free induction decay signal by said first contrast agent.

In the method of the invention it is generally preferred for the first contrast agent to have an electron spin resonance transition with a linewidth of 1 Gauss ($10^{-4}$ Tesla) or less and for the second contrast agent to have an electron spin resonance transition with a linewidth for 3 Gauss ($3 \times 10^{-4}$ Tesla) or more. Conveniently first contrast agent will comprise a stable free radical and the second contrast agent will comprise a paramagnetic metal species. Preferably the ratio of the linewidth of the esr transition of said second agent to that of said first agent is at least 1.5:1, especially at least 2:1, preferably at least 3:1, especially preferably at least 6:1.

For the suppression agent to reduce the FID signal enhancement by the enhancing agent, in principle where the relaxivity of the enhancing and suppression agents are comparable, the degree of stimulability of the suppression agent, that is the fraction of its esr absorption spectrum total peak area that falls within the frequency bandwidth of the second radiation at the primary field of the ESREMRI apparatus, should be lower than that of the enhancing agent. Accordingly, the first and second contrast agents may be so selected that the degree of stimulability by said second radiation of said first contrast agent is greater than that of said second contrast agent.

In the method of the invention, especially where the enhancing agent has two or more lines in the esr spectrum, it may be desirable to use broadband second radiation and/or second radiation of two or more frequency bandwidths, the bandwidths and central frequencies being selected to increase the degree of stimulability of (and preferably to saturate) the esr transitions of the enhancing agent.

For in vivo imaging according to the methods of the invention the first and second contrast agents should of course be physiologically tolerable materials.

In the methods of the invention, the first and second contrast agents are preferably so selected and/or introduced into the sample that during the detection of the free induction decay signal the difference in concentration between the first and second agents is not uniform throughout the volume region in which the first agent is distributed. This may be achieved, for example, by selecting as said first and second contrast agents materials which distribute into different, but overlapping regions of the body and/or by administering the first and second agents in such a way that at the time the free induction decay signals used to generate an image are detected only the first contrast agent is present within the region of interest within the sample.

In the methods of the invention, the enhancing agent will be one which, in the absence of the suppression agent, is capable of allowing ESREMRI to be performed, i.e. one enabling an enhancement of the nuclear spin population difference to be achieved. Thus, the enchancing agent is preferably one for which the stimulated esr transition has a linewidth (at the concentration used and at the field of the ESREMRI apparatus) of 1 Gauss ($10^{-4}$ Tesla) or less, preferably 600 milligauss ($6 \times 10^{-5}$ Tesla) or less, especially preferably 500 milligauss ($5 \times 10^{-5}$ Tesla) or less, particularly preferably 350 milligauss ($3.5 \times 10^{-5}$ Tesla) or less, more preferably 100 milligauss ($10^{-5}$ Tesla) or less and most preferably 50 milligauss ($5 \times 10^{-6}$ Tesla) or less. If the esr spectrum of the enhancing agent contains a plurality of lines, it is furthermore preferred that the total number of these lines be small, for example, 2–10, especially preferably 2 or 3, and/or that the majority of the lines should be relatively narrowly separated at the operating field of the ESREMRI apparatus in order that several or all of the corresponding esr transitions may be excited simultaneously as mentioned above.

Materials useful as the esr transition sources in conventional ESREMRI may thus be used as the enhancing agents and will be discussed in further detail below. Particularly useful enhancing agents may include the physiologically tolerable stable free radicals, for example, the nitroxides. These, unless bound to or held by a larger carrier species, for example a soluble or insoluble macromolecule or a biomolecule, generally distribute widely within the body following intravenous or intravascular administration and rapidly penetrate into the intracellular and extracellular spaces and even possibly cross the blood brain barrier.

The human or animal body generally can be considered to comprise about 5% by volume blood vessels, about 15% by volume extracellular space and about 80% by volume intracellular space. The extracellular space comprises, for example, liquid in connective tissues between the cells. Compounds such as stable free radicals, e.g. nitroxides, are able to penetrate the cell walls and thus distribute through approximately 100% of the volume.

Other magnetically responsive (for example paramagnetic, superparamagnetic, ferromagnetic and ferrimagnetic) materials, such as materials containing transition metal and lanthanide and, possibly, also, actinide species (i.e. atoms or ions) and in particular salts and chelate complexes of paramagnetic metal species and superparamagnetic iron oxide particles, do not generally distribute so widely within the body after intravenous or intravascular administration and have in their esr spectra transitions of very large linewidth and so are particularly suited to use as suppression agents according to the present invention. Thus, the soluble metal chelates on intravenous or intravascular administration distribute only within the blood vessels and the extracellular space and do not penetrate into the intracellular space or cross the blood-brain barrier (unless the blood-brain barrier has been disrupted, for example, by a malignant tumour). Insoluble or particulate such materials, or such materials bound to high molecular weight carriers, will not generally distribute outside the blood vessels and, if particulate, may indeed be rapidly abstracted from the circulatory system by the normal operation of the reticuloendothelial system.

Thus, for example, when a stable free radical enhancing agent is administered iv in the presence of a paramagnetic metal species-containing suppression agent, such as a Gd chelate, only certain body regions, for example the blood vessels and extracellular tissue, will contain both agents, and for those areas containing only the enhancing agent or containing a relatively greater proportion of the enhancing agent, there will be an enhancement of the FID signal. Where both agents are present, the FID signal enhancement will be decreased or eliminated depending upon the relative concentrations of the two agents. Thus, by the method of the present invention enhanced contrast between different tissues or organs may be obtained.

In the liver, for example, which has a very high percentage of extracellular space, contrast between healthy tissue and tumours, which have relatively lower proportions of extracellular space, can be achieved by using the method of the invention.

In general, by using an enhancing agent which distributes into the intracellular space and a suppression agent which distributes into the extracellular space, but not into the intracellular space, a selective suppression of FID signal enhancement can be achieved in tissues containing relatively large cells, a relatively low percentage of extracellular fluid and/or relatively low porosity cell walls.

While suppression of FID signal enhancement using a combination of an enhancing agent and a suppression agent has been observed, the mechanism for such suppression is uncertain. It is thought possible that suppression may result from a combination of one or more, possibly all, of at least three effects. Thus, the magnetic dipoles of the unpaired electrons of the suppression agent (for instance a particulate agent) may create local field inhomogeneities which affect the relaxation of the electron spin system of the enhancing agent thereby reducing the characteristic relaxation times $T_{1e}$ and, more especially, $T_{2e}$ therefor. Collisions between the suppression agent and the enhancing agent may also cause electron spin interchanges between the two. This so-called Heisenberg exchange will affect only $T_{2e}$ of the enhancing agent, but will broaden its esr transition linewidth leading to a lower degree of saturation of that esr transition by the second radiation. The characteristic relaxation times of the nuclear spin system of the imaging nuclei will also be affected by the presence of the suppression agent. A further possible FID signal enhancement suppression mechanism may result from the presence in the ESREMRI system of materials (e.g. the suppression agent) whose esr transitions are not saturated. Coupling between the nuclear spin system and these unsaturated electron spin systems may allow the nuclear spin system a further relaxation route away from the dynamic nuclear polarization achieved by saturating the esr transition of the enhancing agent. In effect, therefore, this represents a leakage from the maximum ESREMRI FID signal enhancement. These suggestions for the mechanisms by which FID signal enhancement may be suppressed are only tentative and it should be recognised that the operability of the present invention is no way dependent on their being correct.

As mentioned above, the suppression agent need not be an agent which distributes in the extracellular space. Suppression agents which are retained within the blood vessels or indeed within any other body conduit or volume may equally be used. All that is necessary is that there be volumes of sample, which are reached earlier by the enhancing agent or in which the enhancing agent distributes relatively more highly than does the suppression agent. Thus, besides the paramagnetic chelates of for example Nycomed (WO-A-89/00557), Schering (EP-A-71564), Quay (U.S. Pat. No. 4,687,659) and Sherry (U.S. Pat. No. 4,639,365), particular mention may be made also of soluble or insoluble carrier-bound paramagnetic species, for example those described by Nycomed in EP-A-186947 and EP-A-184899 or by Schering in EP-A-331616.

In one particular embodiment of the method of the present invention, there may be administered as the enhancing and suppression agents materials which distribute within the same regions of the body. In this embodiment, for FID signal enhancement to occur it is necessary that the first contrast agent should reach the body site of interest before the second contrast agent. This may, for example, be achieved by administering the enhancing agent into a body conduit, for example a blood vessel, upstream of the tissue or organ of interest and by administering the suppression agent downstream of that tissue or organ. If the body conduit is part of a circulatory system, then until the suppression agent circulates and reaches the point of administration of the enhancing agent FID signal enhancement will occur but only for the pathway between the point of administration of the enhancing agent and that of the suppression agent. Since ESREMRI FID signal enhancement enables a reduction in the image aquisition time of several orders of magnitude without significant gain in signal to noise ratio, and even with an improvement in signal to noise ratio, the apparatus can be arranged to obtain an image for which FID signal enhancement only occurs in the tissues or organs between the points of administration of the enhancing and suppression agents. For the circulatory system, to achieve this it will be generally necessary to set the image acquisition time at about 30 seconds or less. While operating at such short image acquisition times may be problematical using conventional MRI, using ESREMRI adequate images may be obtained using even shorter image acquisition times with or without the use of fast imaging techniques, e.g. low flip angle techniques.

The enhancement agent and the suppression agent may, as is clear from the above discussion, be administered together or separately. While MRI contrast media comprising either of these are known, compositions containing both are novel and represent a further aspect of the present invention.

Thus, viewed from a still further aspect the invention provides a contrast medium comprising an ESREMRI free induction decay signal enhancing agent together with an ESREMRI free induction decay signal enhancement suppressing agent, optionally together with one or more carrier or excipient materials. For administration to a human or animal subject, the components of the contrast medium of the invention should be physiologically tolerable.

Viewed from a yet further aspect, the invention also provides the use of a physiological tolerable ESREMRI free induction decay signal enhancing agent and/or a physiologically tolerable ESREMRI free induction decay enhancement suppressing agent for the manufacture of a contrast medium for use in a method of diagnosis practised on the human or animal body involving a method of magnetic resonance imaging according to the present invention.

As indicated above, in the contrast medium of the invention the esr spectra of the enhancing and suppression agents are preferably such that a stimulable esr transition of the enhancing agent may be substantially saturated without an esr transition of the suppressing agent also being substantially saturated. In general, all paramagnetic, superparamagnetic, ferromagnetic and ferrimagnetic compounds have the potential for use as suppression agents in the methods of the present invention. Particularly preferred as suppression agents however, are paramagnetic materials having large magnetic moments and poor $T_1$-relaxation effects. In this regard, insoluble (i.e. particulate) paramagnetic materials may be more effective than soluble paramagnetic materials.

The free induction decay signal enhancement suppressing effect of paramagnetic materials will increase with the effective magnetic moment of the paramagnetic metal species within the paramagnetic material, for example the paramagnetic metal ion in a paramagnetic chelate. The suppressing effect is also dependent upon the spin quantum number of the paramagnetic metal species and accordingly it is particularly desirable that both the spin quantum number and the effective magnetic moment of the metal species be as large as possible. Thus, compounds, salts or complexes, in particular chelate complexes, comprising a paramagnetic metal atom or ion may be used as the suppression agent according to the present invention. In such agents, the paramagnetic metal atom or ion is preferably non-radioactive and is particularly preferably selected from the elements having atomic numbers 21–29, 42, 44 and 57–71. Examples of suitable metals include dysprosium, holmium, erbium, terbium, europium, gadolinium, thulium, iron, manganese, cobalt, ytterbium, nickel, chromium and copper.

Since the free induction decay signal enhancement suppressing effect of a paramagnetic species is to some extent dependent on the magnitude of the effective magnetic moment of the paramagnetic metal species, it is of course preferred to use paramagnetic metal species having as large as possible effective magnetic moments. In particular, it is preferred to use species having magnetic moments of at least 1.85, preferably at least 4.64, and especially preferably at least $6.49 \times 10^{-23}$ A.m$^2$ (that is 2, 5, and 7 Bohr magnetons respectively). Particularly preferred paramagnetic metal ions, in order of increasing magnetic moment, include $Yb^{3+}$, $Co^{3+}$, $Fe^{2+}$, $Mn^{2+}$, $Fe^{3+}$, $Tm^{3+}$, $Gd^{3+}$, $Eu^{2+}$, $Tb^{3+}$, $Er^{3+}$, $Ho^{3+}$ and $Dy^{3+}$.

In general, dysprosium, holmium, gadolinium, and iron chelates are especially preferred.

Potential suppression agents include both ionic and non-ionic radicals, such as for example those described below as well as those described in EP- A-133674 (Schering), WO-A-87/01594 (Amersham) and WO-A-87/05222 (Rosen). Suitable paramagnetic metal species containing materials include metal chelates such as ferrioxamine and derivatives thereof and other compounds described in U.S. Pat. No. 4,637,929 (Salutar) and EP-A-235361 (Salutar), paramagnetic particles and liposomes such as those described for example in U.S. Pat. No. 4,615,879 (Runge), EP-A-184899 (Nycomed) and EP-A-160552 (Vestar), paramagnetic chelates such as GADOTA (as described in U.S. Pat. No. 4,639,365 (Sherry), WO-A-87/06229 (Guerbet) ana U.S. Pat. No. 4,647,447 (Schering)), GdDTPA as aescribea in U.S. Pat. No. 4,647,447 (Sobering), GdDO3A as described in EP-A-232751 (Squibb), GdDTPA amides (in particular the bismethylamide) as described in WO-A-86/02841 (Salutar), DYDTPA as described U.S. Pat. No. 4,647,447 (Schering), DYDOTA as described in U.S. Pat. No. 4,647,447 (Schering), DyDO3A as described in EP-A-232751 (Squibb) and DYDTPA amides (in particular the bismethylamide) as described in WO-A-86/02841 (Salutar). The other paramagnetic metal chelates, derivatives and salts thereof covered by U.S. Pat. No. 4,647,447 (Schering), WO-A-87/06229 (Guerbet), EP-A-232751 (Squibb), WO-A-86/02841 (Salutar), EP-A-250358 (Schering), EP-A-263059 (Schering), DE-A-3324235 (Schering), EP-A-130934 (Schering), EP-A-173163 (Schering), EP-A-258616 (Salutar), DE-A-3633245 (Schering), EP-A-255471 (Schering) and in WO-A-89/00557 (Nycomed) may also be used as suppression agents in the methods of the present invention. Tissue -specific or blood-pooling paramagnetic materials such as those described for example in EP-A-230893 (Bracco), U.S. Pat. No. 4,730,066 (Mallinckrodt), U.S. Pat. No. 4,746,507 (Salutar) and the macromolecule bound materials described in EP-A-186947 (Nycomed), WO-A-85/05554 (Amersham) and WO-A-87/01594 (Amersham) may also be Used as the suppression agents.

In paramagnetic metal species-containing suppression agents, the preferred metals are the lanthanides, and iron, chromium and manganese. Dysprosium, gadolinium and iron are particularly preferred.

As may readily be understood, for in vivo imaging it is of course preferred to use suppression agents which have as low a toxicity as possible. Thus, particularly preferred amongst the paramagnetic metal species-containing materials are metal chelates having an LD$_{50}$ in mice of at least 5 mmol/kg bodyweight. This includes for example GdDTPA, DyDTPA, GdDOTA, DYDOTA, GdDO3A, GdDTPA-BMA (the $Gd^{3+}$, chelate of the bismethylamide of DTPA), DyDTPA-BMA,GdBMO (the $Gd^{31+}$ chelate of the bi-cyclic amide of DTPA sometimes referred to as gadopenamide) and other non-ionic complexes of Gd and Dy with derivatives of DTPA and DOTA such as are mentioned in the literature referred to above. Iron salts and chelates, e.g. Fe II and Fe III salts and chelates are also preferred, especially for oral or rectal administration.

As mentioned above, it is also possible to use ferromagnetic, ferrimagnetic and superparamagnetic particles as suppression agents in the methods of the present invention. Examples of such magnetic particles include for example those described by Nycomed in U.S. Pat. No. 4,863,715, Schröder in WO-A-85/02772, by Ugelstad et al in WO-A-83/03920, by Molday in U.S. Pat. No. 4,675,173, by Advanced Magnetics in WO-A-88/00060, by Schering in DE-A-3443252 and DE-A-3443251 and by Brown in WO-A-86/01112. Such particles preferably have particle sizes in the ranges appropriate for iv administration, for example up to 2 micrometers, preferably up to 1.5 micrometers and especially preferably up to 1 micrometer. For oral administration or for other administration into body cavities having external escape ducts (e.g. the bladder, rectum, etc) much larger particles, e.g. up to 100 micrometers, may of course be used.

Thus, in general the suppression agents can be seen to fall into five categories (a) those which distribute extracellularly (for example GD-DTPA and GD-DOTA and salts and derivatives thereof), (b) paramagnetic materials which distribute only within body cavities or conduits such as the circulatory system (for example materials-which comprise a high molecular weight soluble or insoluble carrier which carries or entraps the paramagnetic metal species, for example the Gd-dextran and Gd-starch materials of EP-A-186947 and EP-A-184899), (c) particulate superparamagnetic, ferromagnetic or ferrimagnetic materials, (d) materials in which the paramagnetic species is bound to a tissue-targetting biomolecule, and (e) stable free radicals, which may distribute into the same or nearly the same volumes of the body as the enhancing agent.

Generally, it is preferred that the suppression agent should have an esr linewidth of least 2 Gauss ($2 \times 10^{-4}$ Tesla), for example 2–400 Gauss ($2-400 \times 10^{-4}$ Tesla) preferably 5–300 Gauss ($5-300 \times 10^{-4}$ Tesla) and more preferably 20–200 Gauss ($3-5 \times 10^{-3}$ Tesla), especially 30–50 Gauss. In the alternative, where the suppression agent has a relatively narrow esr linewidth, for example one comparable to that of the enhancing agent, it is particularly preferred that the esr transitions of the suppression agent and of the enhancing agent should not overlap or should not overlap to a significant extent.

For the enhancing agent in the methods of the invention, any paramagnetic material capable of enhancing the nuclear spin population difference in ESREMRI may be used. Generally, stable free radicals will be preferred. Suitable such materials are disclosed and discussed in WO-A-88/10419. As an example, the use of a paramagnetic material such as the stable free radical anion chloranil semiquinoneanion radical might be contemplated although for in vivo imaging less toxic materials will generally be used. Where a stable free radical is to be used, however, it may be necessary to generate the stable free radical species from a precursor compound before administration of the contrast medium, e.g. by exposure of the contrast medium to radiation or heat or by chemical treatment.

One particularly interesting group of stable free radicals are the nitroxide stable free radicals of which many have been suggested in the literature for use as spin labels or as paramagnetic contrast agents for conventional MRI. Moreover, several of these compounds are readily available commercially, for example from Aldrich. The nitroxide stable free radicals of particular interest as their toxicities and pharmacokinetics have been studied and show the compounds to be suitable for in vivo MRI and as the esr linewidths, especially for compounds in which the atoms adjacent to the NO moiety are fully substituted (i.e. carry no protons), may be adequately small at the concentrations required to give contrast enhancement.

As the enhancing agent it is particularly preferred that a nitroxide stable free radical be used wherein the NO moiety occurs in a 5- to 7-membered saturated or ethylenically unsaturated ring with the ring positions adjacent to it being occupied by doubly saturated carbon atoms and with one of the remaining ring positions being occupied by a carbon, oxygen or sulphur atom and the remaining ring positions being occupied by carbon atoms.

Preferred nitroxides include those represented by formula I

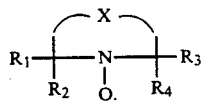
(I)

wherein $R_1$ to $R_4$ may represent lower (for example $C_{1-4}$) alkyl or hydroxyalkyl groups and R may also represent carboxy substituted $C_{1-10}$ alkyl groups and $R_2$ may also represent a higher (e.g. $C_{5-20}$) alkyl group or a carboxy substituted $C_{1-20}$ alkyl group, and X represents an optionally substituted, saturated or ethylenically unsaturated bridging group having 2 to 4 atoms in the backbone of the bridge, one of the backbone atoms being carbon, oxygen or sulphur and the remaining backbone atoms being carbon.

In formula I, the moieties $CR_1R_2$ and $CR_3R_4$ are preferably the same. Particularly preferably, $R_1$ to $R_4$ are all methyl groups.

In formula I, the optional substitution on X, which preferably is an optionally mono-unsaturated $C_{2-3}$ chain, may for example take the form of halogen atoms or oxo, amino, carboxyl, hydroxy or alkyl groups or combinations or derivatives thereof such as for example amide, ester, ether or N-attached heterocyclic, e.g. 2,5-dioxopyrrolidino, groups. Many examples of substituted X groups are described in the literature mentioned below.

The nitroxide molecule may if desired be bound to a further substance, such as for example a sugar, polysaccharide, protein or lipid or to other biomolecules, for example to enhance the blood pooling effect or the tissue- or organ- targetting ability of the nitroxide stable free radical.

Thus for example CA-A-1230114 (Schering) describes nitroxide stable free radicals (for use as MRI contrast agents) of formula II

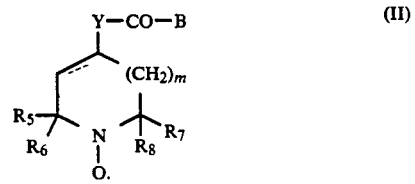
(II)

wherein B is a protein, sugar or lipid residue or a group $—NR_9R_{10'}$ $==$ is a double or single bond, Y is $—(CH_2\text{-})_n—$ or if $==$ is a single bond also $—NH\ CO(CH_2)_n—$, n is a number from 0 to 4, m is a number from 0 to 2, $R_9$ and $R_{10}$ are hydrogen or alkyl optionally substituted by hydroxy, acyloxy or alkylidenedioxy (both $R_9$ and $R_{10}$ however cannot simultaneously be hydrogen or unsubstituted alkyl), $R_5$ and $R_7$ are alkyl and $R_6$ and $R_8$ are optionally hydroxy substituted alkyl.

Furthermore, WO-A-87/05222 (MRI Inc.) describes nitroxide stable free radicals (again for use as MRI contrast agents) of formula III

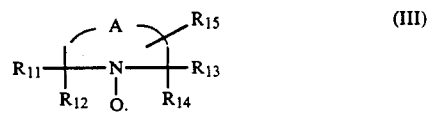
(III)

(wherein $R_{11}$ to $R_{14}$ are each optionally hydroxyl substituted $C_{1-4}$ alkyl, A is $C_{2-4}$ alkylene or alkenylene, $—CH_2—O—CH_2—$ or $—CH_2—S—CH_2—$ and $R_{15}$ is a group $—E—\ COOM$ where E is $C_{1-8}$ alkylene and M is $NH_4$, Na or K or $R_{15}$ is $—N(Alk)_3^+\ Hal^-$ where Hal is a halogen atom and Alk is $C_{1-8}$ alkyl optionally substituted by hydroxy or esterified hydroxy), of formula IV

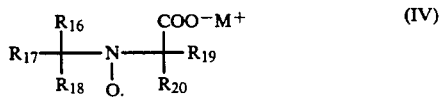
(IV)

(wherein m is as defined above, $R_{16}$, $R_{17}$ and $R_{18}$ are alkyl, cycloalkyl, heterocyclic aliphatic, carbocyclic aryl or heterocyclic aryl and $R_{19}$ and $R_{20}$ are carbocyclic or heterocyclic aryl) and of formula V

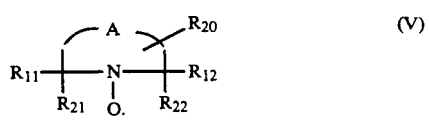
(V)

(wherein $R_{11}$, $R_{12}$, $R_{20}$ and A are as defined above and $R_{21}$ and $R_{22}$ are $—(C_{1-8}$ alkylene$)—R_{23}$ where $R_{23}$ is hydrogen, $R_{15}$, $NH_2$, $NHR_{15}$ or $NR_{11}R_{12}$ and $R_{15}$ is as defined above).

Still further nitroxide stable free radicals for use as MRI contrast agents are disclosed in WO-A-87/01594 (Amersham) and in the references cited therein. The nitroxides disclosed by Amersham are bound, optionally through the agency of linear molecules, to polysaccharides such as dextran, starch and cellulose.

A nitroxide stable free radical of formula VI

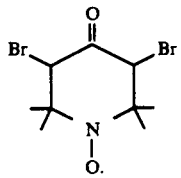

(VI)

is disclosed by Alcock et al in Tetrahedron 33 (1977) 2969-2980.

Nitroxide stable free radicals of formula VII

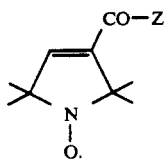

(VII)

(wherein Z is a hydroxyl, ethoxy or a substituted amino group) are disclosed by Golding et al. in Synthesis 7 (1975) 462-463.

Nitroxide stable free radicals of formulae VIII and IX

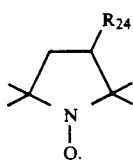

(VIII)

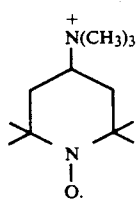

(IX)

(wherein $R_{24}$ is COOH or CONHCH(CH$_2$OH)-CHOHCH$_2$OH) and their pharmacokinetics are discussed by Eriksson et al. in J. Pharm. Sci. 77 (1988) 97-103.

Moreover, nitroxide stable free radicals are discussed generally by C. F. Chignell in "The Application of Electron Spin Resonance and Spin-labelling in Biochemistry and Pharmacology", pages 1 to 6, a publication which indicates at page 6 that the following nitroxide stable free radicals are commercially available from Aldrich:

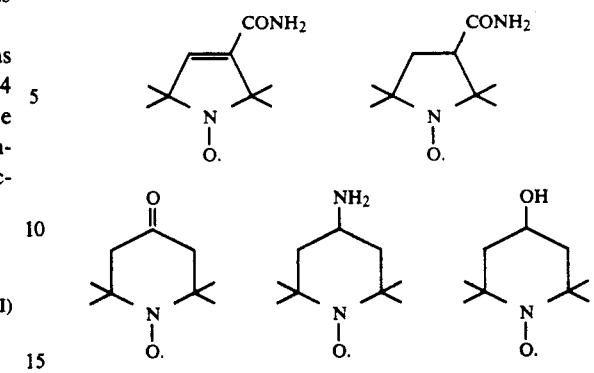

Other paramagnetic materials, the use of which may be contemplated, include the 3,5-dichloro-2,4,6-trihypha-(hydroxyalkoxy or tri(hydroxyalkyl)silyl)phenoxy radicals and the di(tri(hydroxyalkyl)silanyl)cyclobutadienoquinones, in either case the hydroxyalkyl moieties conveniently containing from 2 to 4 carbon atoms and being for example 2-hydroxyethyl, 2,3-dihydroxypropyl or 3,4-dihydroxybutyl groups.

The enhancing agent and suppression agent may be administered separately or together and may be administered enterally or parenterally, preferably by parenteral injection or infusion. Where the agents are administered separately this will generally be in such a manner that the two meet at the sample or body sites at which FID signal enhancement suppression is to occur. Thus, as discussed above, the suppression agent may be injected downstream of a site of interest with the enchancing agent being administered upstream of that site. Alternatively the suppression agent might be infused directly into the bladder to ensure that no enhanced FID signal builds up in the bladder and swamps out the image of a nearby organ.

When calculating the dosages of the enhancing agent and the suppression agent the different volumes of the body space should be taken into account where the two agents do not distribute through the same body space.

Thus the dosages should be calculated so that the concentration ratio of the two agents at volumes where FID signal enhancement is to be suppressed is sufficient to ensure that suppression occurs.

For use in in vivo diagnostic imaging, the enhancing agent will generally be administered in a dosage of up to 6mmol/kg bodyweight, preferably up to 5 mmol/kg, more preferably up to 3 mmol/kg, more preferably up to 2.5 mmol/kg, especially about 2 mmol/kg bodyweight. The minimum effective dose will depend upon what is in the particular circumstances considered to be an "effective" enhancement of the FID signal, but will conveniently be at or above about 0.1 mmol/kg, preferably at or above 0.5 mmol/kg, more preferably at or above 1 mmol/kg bodyweight. Generally dosages will preferably be such as to ensure that at sites where suppression of the FID signal enhancement is not desired the concentration of the enhancing agent is 1-10 mm, preferably 2-8 mM, especially 3-6 mM. The dosage ratios of the enhancing and suppression agents will preferably be such that in the volumes where FID signal enhancement suppression is desired the mole ratio of enhancing agent to suppression agent is in the range of 10:1 to 1:4, preferably 4:1 to 1:4, more preferably 2:1 to 1:2, especially 1:1. Typically, for a nitroxide enhancer and a gadolinium chelate suppressor one could work with dosages of about 0.5 mmol Gd/kg bodyweight, for example, and 2.5-3 mmol nitroxide/kg bodyweight, for example.

In general, for each of the contrast agents, the maximum dosage should conveniently%be less than about 1/10 of the $LD_{50}$, preferably less than about 1/20 of the $LD_{50}$, more preferably less than about 1/50 of the $LD_{50}$.

Where a particulate superparamagnetic, ferromagnetic or ferrimagnetic material (preferably a supermagnetic material) is used as a suppression agent, the ratio of the enhancing agent to the suppression agent (where the enhancing agent is a stable free radical which distributes extra- and intracellularly) will conveniently be in the range of 3:1 to 40:1, preferably 10:1 to 30:1, more preferably 15:1 to 25:1, moles enhancer to moles Fe. For example 1 to 10 mg of Fe/ml may be used with 1-5 mm nitroxide.

The contrast media may be formulated in any convenient administration form but particularly preferably will be in the form of solutions or suspensions, e.g. in water for injections or physiological saline, for injection or infusion. Such compositions may of course contain conventional pharmaceutical additives or excipients, e.g viscosity modifiers, osmolality adjusting agents, buffers etc. Where the suppression agent comprises a paramagnetic metal chelate, the contrast medium will also preferably contain a slight excess of the chelating agent, e.g. as discussed by Schering in DE-A-3640708.

The disclosures of all of the documents mentioned herein are incorporated by reference.

The following Examples of suppression and/or enhancing agents are provided to illustrate the invention further without in any way limiting its scope.

EXAMPLE 1

Enhancing agent

| 4-Hydroxy-2,2,6,6-tetramethyl piperidine-1-oxy (Tempol) | 4.71 g |
|---|---|
| Water for injections | ad 100 ml |

The nitroxide stable free radical, available from Aldrich Chemical Co., is dissolved in the water for injections and the solution, like the compositions of the other Examples, is filled into an ampoule under sterile conditions.

The nitroxide stable free radicals

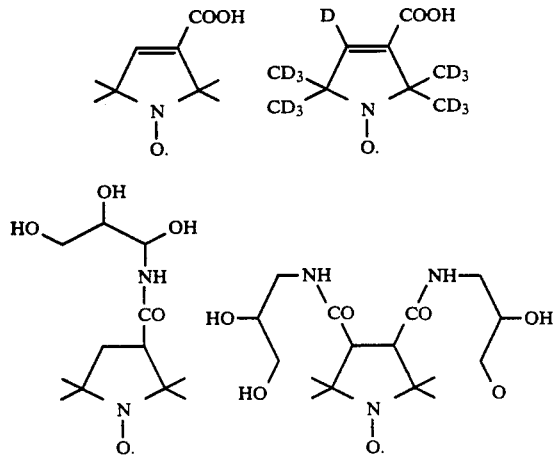

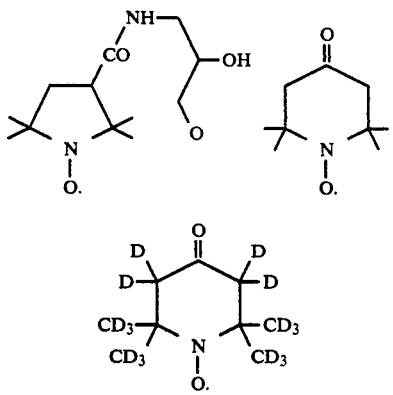

may be used in place of in place of Tempol.

EXAMPLE 2

Suppression agent

| Gadolinium DTPA-dimeglumine salt | 46.90 g |
|---|---|
| Meglumine | 39 mg |
| DTPA | 15 mg |
| Water for injections | ad 100 ml |

The gadolinium salt, prepared according to Example 5 of U.S. Pat. No. 4,647,447, meglumine and DTPA, are dissolved in the water for injections. The solution is filled into a 100 ml vial and sterilized by heating. The resulting solution contains 0.5-mM Gd as its DTPA chelate. (This is equivalent to Magnevist ® (20ml)).

EXAMPLE 3

Combined Agent

| Superparamagnetic particles | 100 mg |
|---|---|
| Tempol | 0.94 g |
| Water for injections | ad 20 ml |

Superparamagnetic magnetite starch particles, produced by the method of Schröder (supra), having a mean overall particle size of 0.4 micrometers and a Fe content of 80% by weight, are dispersed by sonication in a solution produced by dissolving the nitroxide in the water for injections.

EXAMPLE 4

Combined agent

| Dysprosium chelate of 1,4,7-tris carboxymethyl-1,4,7,10-tetraazacyclododecane (Dy D03A) | 2.5 g |
|---|---|
| Tempol | 3.9 g |
| Water for injections | ad 100 ml |

The Dy D03A, produced by the method of Squibb (EP-A-232751), and the nitroxide are dissolved in the water for injections to give a solution with a mole ratio of Dy to nitroxide of 1:5 and a Dy concentration of 0.05M as the D03A chelate.

We claim:
1. An electron spin resonance enhancing magnetic resonance imaging contrast medium comprising two separate contrast agents wherein the first contrast agent is an electron spin resonance enhancing magnetic resonance imaging signal enhancing agent, and the second contrast agent is an electron spin resonance enhancing magnetic resonance imaging signal suppressing agent of said first agent to increase contrast in different parts of a magnetic image generated using said contrast medium.

2. A contrast medium as claimed in claim 1 wherein said enhancing agent has an esr transition having a linewidth of 1 Gauss or less and said suppressing agent has an esr transition having a linewidth of at least 2 Gauss.

3. A contrast medium as claimed in claim 1 wherein said enhancing and suppression agents have esr transitions the ratio of whose linewidths is no more than 1:1.5.

4. A contrast medium as claimed in claim 1 wherein said enhancing and suppression agents have esr transitions the ratio of whose linewidths is no more than 1:6.

5. A contrast medium as claimed in claim 1 containing as a said enhancing agent a stable free radical.

6. A contrast medium as claimed in claim 5 containing a physiologically tolerable nitroxide stable free radical.

7. A contrast medium as claimed in claim 1 containing as a said suppressing agent a material comprising superparamagnetic, ferromagnetic or ferrimagnetic particles or paramagnetic metal ions.

8. A contrast medium as claimed in claim 7 containing paramagnetic metal ions selected from paramagnetic Ni, Cr, Cu, Yb, co, Fe, Mn, Tm, Gd, Eu, Tb, Er, Ho and Dy ions.

9. A contrast medium as claimed in claim 7 containing as said suppressing agent a physiologically tolerable chelate complex of a paramagnetic metal ion, or a physiologically tolerable salt of a said complex.

10. A contrast medium as claimed in claim 9 comprising a chelate complex selected from GdDTPA, GdDOTA, GdDO3A, GdDTPA-BMA, DyDTPA, DyDOTA, DyDTPA-BMA and Gd BMO or a physiologically tolerable salt of a said complex.

11. A contrast medium as claimed in claim 1 wherein as said enhancing agent is used a material which distributes intracellularly and as said suppressing agent is used a material which does not distribute intracellularly.

12. A method of generating a magnetic resonance image of a sample, said method comprising exposing said sample to pulses of a first radiation of a frequency selected to excite nuclear spin transitions in selected nuclei in said sample, detecting a signal from said sample and generating a said image from said detected signal, said method further comprising introducing into said sample a first paramagnetic contrast agent and exposing said sample to a second radiation of a frequency selected to excite an electron spin transition of said first contrast agent coupled to nuclear spin transitions of at least some of said selected nuclei whereby to enhance the signal therefrom, characterised in that said method also comprises introducing into said sample a second contrast agent having at least one transition in the esr spectrum thereof whereby to reduce the enhancement of said signal by said first contrast agent to increase contrast in different parts of the generated magnetic image of the sample.

13. A method of generating a magnetic resonance image of a sample, said method comprising exposing said sample to pulses of a first radiation of a frequency selected to excite nuclear spin transitions in selected nuclei in said sample, detecting a signal from said sample and generating a said image from said detected signal, said method further comprising introducing into said sample a first paramagnetic contrast agent and exposing said sample to a second radiation of a frequency selected to excite an electron spin transition of said first contrast agent coupled to nuclear spin transitions of at least some of said selected nuclei whereby to enhance the signal therefrom, characterised in that said method further comprises introducing into said sample a second contrast agent wherein said first contrast agent has an electron spin resonance transition with a linewidth of 1 Gauss or less and wherein said second contrast agent has an electron spin resonance transition with a linewidth of 3 Gauss or more.

14. A method of generating a magnetic resonance image of a sample, said method comprising exposing said sample to pulses of a first radiation of a frequency selected to excite nuclear spin transitions in selected nuclei in said sample, detecting signal from said sample and generating a said image from said detected signal, said method further comprising introducing into said sample a first paramagnetic contrast agent and exposing said sample to a second radiation of a frequency selected to excite an electron spin transition of said first contrast agent coupled to nuclear spin transitions of at least some of said selected nuclei whereby to enhance the signal therefrom, characterised in that said method further comprises introducing into said sample a second contrast agent wherein said first contrast agent comprises a stable free radical and wherein said second contrast agent comprises a paramagnetic metal species.

15. A method of generating a magnetic resonance image of a sample, said method comprising exposing said sample to pulses of a first radiation of a frequency selected to excite nuclear spin transitions in selected nuclei in said sample, detecting signal from said sample and generating a said image from said detected signal, said method further comprising introducing into said sample a first paramagnetic contrast agent and exposing said sample to a second radiation of a frequency selected to excite an electron spin transition of said first contrast agent coupled to nuclear spin transitions of at least some of said selected nuclei whereby to enhance the signal therefrom, characterised in that said method also comprises introducing into said sample a second contrast agent having at least one transition in the esr spectrum thereof wherein the ratio of the linewidth of the esr transition of said second agent to that of said first agent is at least 1.5:1.

16. A method of generating a magnetic resonance image of a sample, said method comprising exposing said sample to pulses of a first radiation of a frequency selected to excite nuclear spin transitions in selected nuclei in said sample, detecting signal from said sample and generating a said image from said detected signal, said method further comprising introducing into said sample a first paramagnetic contrast agent and exposing said sample to a second radiation of a frequency selected to excite an electron spin transition of said first contrast agent coupled to nuclear spin transitions of at least some of said selected nuclei whereby to enhance the signal therefrom, characterised in that said method further comprises introducing into said sample a second contrast agent having at least one transition in the esr spectrum thereof, wherein said first and second contrast agents are so selected that the degree of stimulability by said second radiation of said first contrast agent is greater than that of said second contrast agent.

17. A method as claimed in claim 12 wherein as said radiation is used broadband radiation or radiation of at least two frequency bandwidths.

18. A method as claimed in claim 12 wherein said first and second contrast agents are introduced as a contrast medium comprising an electrons pin resonance enhanced magnetic resonance imaging signal enhancing agent together with an electron spin resonance enhanced magnetic resonance imaging signal enhancement suppressing agent, optionally together with one or more carrier or excipient materials.

19. A method as claimed in claim 12 wherein the timing of the period of signal detection, and/or the timing and/or location of the introduction of said first contrast agent and/or of said second contrast agent are selected to ensure that at the time of signal detection for a selected region of said sample said first contrast agent but not said second contrast agent is distributed therein.

* * * * *